United States Patent
Ramaswamy et al.

(10) Patent No.: US 10,095,114 B2
(45) Date of Patent: Oct. 9, 2018

(54) PROCESS CHAMBER FOR FIELD GUIDED EXPOSURE AND METHOD FOR IMPLEMENTING THE PROCESS CHAMBER

(71) Applicant: Applied Materials, Inc., Santa Clara, CA (US)

(72) Inventors: Kartik Ramaswamy, San Jose, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 701 days.

(21) Appl. No.: 14/589,987

(22) Filed: Jan. 5, 2015

(65) Prior Publication Data

US 2016/0139503 A1    May 19, 2016

Related U.S. Application Data

(60) Provisional application No. 62/080,228, filed on Nov. 14, 2014.

(51) Int. Cl.
| | |
|---|---|
| G03F 1/80 | (2012.01) |
| G03F 7/20 | (2006.01) |
| H01J 11/22 | (2012.01) |
| H01J 11/32 | (2012.01) |
| H01J 37/32 | (2006.01) |
| G03F 7/26 | (2006.01) |
| H05H 1/48 | (2006.01) |
| H05H 1/24 | (2006.01) |

(52) U.S. Cl.
CPC .................. *G03F 7/20* (2013.01); *G03F 7/26* (2013.01); *H01J 11/22* (2013.01); *H01J 11/32* (2013.01); *H01J 37/32541* (2013.01); *H01J 37/32568* (2013.01); *H05H 2001/2462* (2013.01); *H05H 2001/485* (2013.01)

(58) Field of Classification Search
CPC ...... H05H 2001/2462; H05H 2001/485; H01J 11/22; H01J 11/32; H01J 37/32568; H01J 37/32541
See application file for complete search history.

(56) References Cited

U.S. PATENT DOCUMENTS

| | | |
|---|---|---|
| 4,842,683 A | 6/1989 | Cheng et al. |
| 5,215,619 A | 6/1993 | Cheng et al. |
| 5,345,145 A * | 9/1994 | Harafuji ............ H01J 37/32165 118/723 R |
| 6,113,731 A | 9/2000 | Shan et al. |

(Continued)

*Primary Examiner* — Parviz Hassanzadeh
*Assistant Examiner* — Nathan K Ford
(74) *Attorney, Agent, or Firm* — Patterson + Sheridan, LLP

(57) ABSTRACT

A method and apparatus disclosed herein apply to processing a substrate, and more specifically to a method and apparatus for improving photolithography processes. The apparatus includes a chamber body, a substrate support disposed within the chamber body, and an electrode assembly. The substrate support has a top plate disposed above the substrate support, a bottom plate disposed below the substrate support, and a plurality of electrodes connecting the top plate to the bottom plate. A voltage is applied to the plurality of electrodes to generate an electric field. Methods for exposing a photoresist layer on a substrate to an electric field are also disclosed herein.

14 Claims, 5 Drawing Sheets

(56) References Cited

U.S. PATENT DOCUMENTS

| | | | |
|---|---|---|---|
| 6,143,124 A * | 11/2000 | Ahn | H01J 37/32009 118/623 |
| 6,488,807 B1 | 12/2002 | Collins et al. | |
| 6,889,627 B1 * | 5/2005 | Hao | H01J 37/32458 118/715 |
| 2002/0129902 A1 * | 9/2002 | Babayan | C23C 16/402 156/345.45 |
| 2003/0037880 A1 * | 2/2003 | Carducci | H01J 37/32522 156/345.43 |
| 2008/0182412 A1 * | 7/2008 | Bailey, III | H01J 37/32366 438/689 |
| 2015/0135993 A1 * | 5/2015 | Buckland | B01J 19/087 106/287.24 |

* cited by examiner

PROCESS CHAMBER FOR FIELD GUIDED EXPOSURE AND METHOD FOR IMPLEMENTING THE PROCESS CHAMBER

CROSS-REFERENCE TO RELATED APPLICATIONS

This application claims priority from U.S. Provisional Application Ser. No. 62/080,228, filed Nov. 14, 2014, which is hereby incorporated by reference in its entirety.

BACKGROUND

Field

The present disclosure generally relates to methods and apparatuses for processing a substrate, and more specifically to methods and apparatuses for improving photolithography processes.

Description of the Related Art

Integrated circuits have evolved into complex devices that can include millions of components (e.g., transistors, capacitors, and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, a 193 nm ArF laser, an electron beam, an ion beam, or other source. Excess solvent may then be removed in a pre-exposure bake process.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, and, particularly, the photoresist layer may be developed and rinsed. Depending on the type of photoresist used, regions of the substrate that were exposed to electromagnetic radiation may be either resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as lower throughput, increased line edge roughness, and/or decreased resist sensitivity.

Therefore, there is a need for a method and apparatus for improving photolithography processes.

SUMMARY

A method and apparatus disclosed herein apply to processing a substrate, and more specifically to a method and apparatus for improving photolithography processes. In one embodiment, a processing chamber having a chamber body, a substrate support, and an electrode assembly is provided. The substrate support is disposed in the chamber body. The electrode assembly includes a top plate, a bottom plate and a plurality of electrodes. The top plate is disposed above the substrate support. The bottom plate is disposed below the substrate support. The plurality of electrodes connects the top plate and the bottom plate. The plurality of electrodes generates an electric field when a voltage is applied.

In another embodiment, a processing chamber having a chamber body, a substrate support, and an electrode assembly is provided. The substrate support is disposed in the chamber body. The electrode assembly is disposed in a processing volume defined by the chamber body. The electrode assembly includes a top plate, a bottom plate, and a plurality of electrodes. The top plate is disposed above the substrate support. The bottom plate is disposed below the substrate support. The plurality of electrodes connects the top plate to the bottom plate. Each electrode has a first end and a second end. The first end contacts the top plate. The second end contacts the bottom plate. The electrodes are operable, upon application of a voltage, to generate an electric field. The electric field is directly above and parallel to the substrate support.

In another embodiment, a method for exposing a photoresist layer on a substrate to a field having field lines is provided. The method positioning a substrate on a substrate support surrounded by a plurality of electrodes, applying a voltage to the electrodes to generate a field having field lines running directly above and parallel to the substrate. Applying a voltage to the electrodes includes applying a base voltage to one of the electrodes, and applying a fraction of the base voltage to the remaining electrodes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
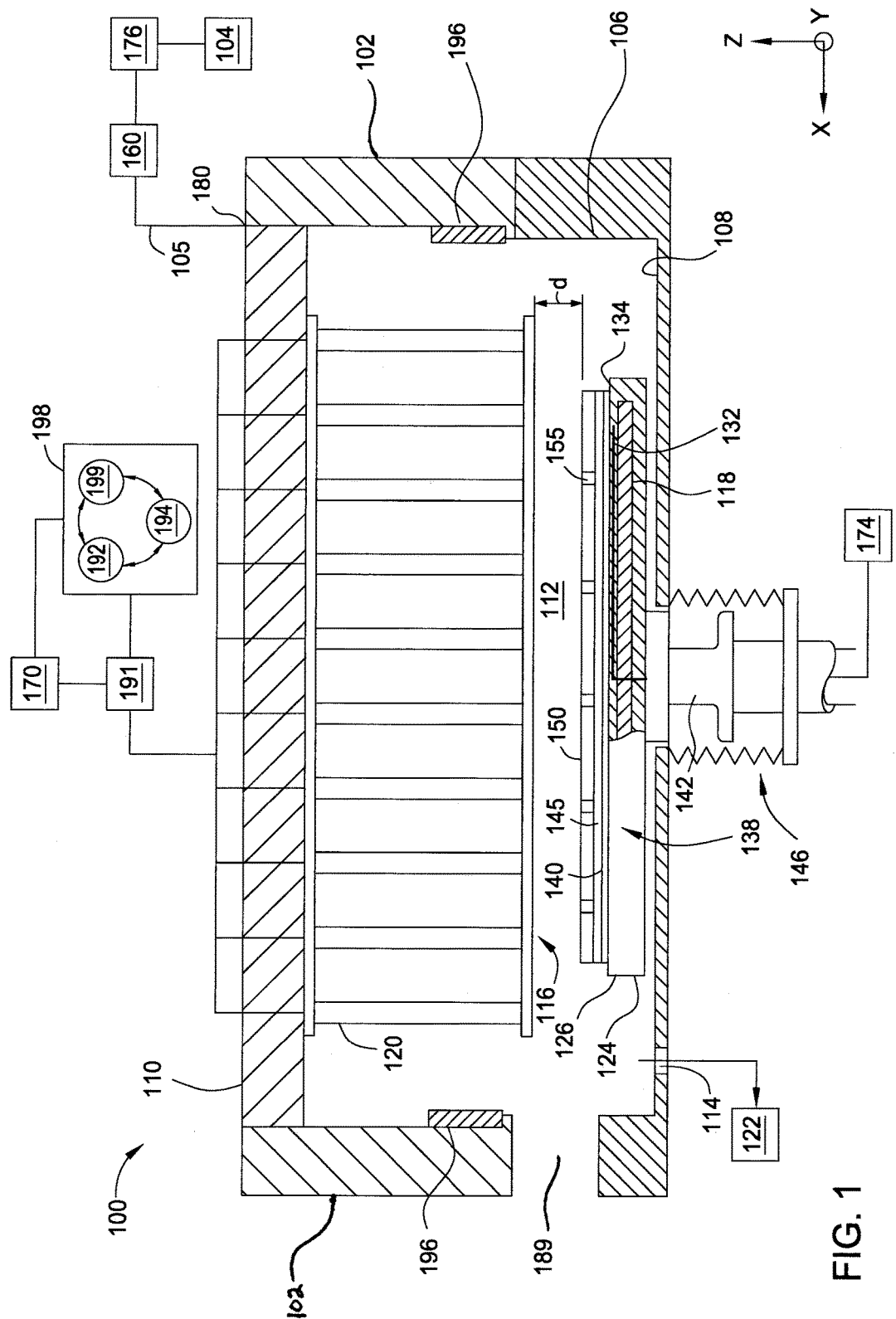
FIG. 1 is a schematic cross-sectional view of an apparatus for processing a substrate, a substrate support assembly shown supporting the substrate in a lowered position.

FIG. 1 is a schematic cross-sectional view of an apparatus for conducting a portion of a photolithographic process on a substrate, according to one example of the disclosure. As shown in the example of FIG. 1, the apparatus may be in the form of a vacuum processing chamber 100. The processing chamber 100 may be an independent processing chamber. Alternatively, the processing chamber 100 may be part of a processing system, such as, an in-line processing system, a cluster processing system, or a track processing system.

The processing chamber 100 includes a chamber body 102, an electrode assembly 116, and a substrate support assembly 138. The chamber body 102 includes sidewalls 106, a lid 110, and a bottom 108. The chamber body 102 at least partially encloses a processing volume 112. The processing volume 112 is accessed through a slit valve 189 configured to facilitate movement of a substrate 140 into and out of the processing chamber 100. In embodiments where the processing chamber 100 is part of a processing system, the substrate transfer port may allow for the substrate 140 to be transferred to and from a transfer chamber.

A pumping port 114 may optionally be disposed through one of the lid 110, sidewalls 106 or bottom 108 of the processing chamber 100 to couple the processing volume 112 to pumping system 122. The pumping system 122 may include various vacuum pumping components, such as a vacuum pump and throttle valve for controlling the vacuum level within the processing chamber. The pumping components may reduce the pressure of the processing volume 112 and exhaust any gases and/or process by-products out of the processing chamber 100.

The substrate support assembly 138 is centrally disposed within the processing chamber 100. The substrate support assembly 138 supports the substrate 140 during processing. The substrate support assembly 138 may include a body 124 that encapsulates an optional electrode assembly 118. The body 124 may comprise, for example, a metal, such as aluminum, or a ceramic.

Generally, the substrate support assembly 138 has a first surface 134 and a second surface 126. The first surface 134 is opposite the second surface 126. The first surface 134 is configured to support the substrate 140. The second surface 126 has a stem 142 coupled thereto. The substrate 140 is positioned on the first surface 134 of the substrate support assembly 138. The substrate 140 may be any type of substrate, such as a dielectric substrate, a glass substrate, a semiconductor substrate, or a conductive substrate. The substrate 140 may have a layer 145 disposed thereon. The layer 145 may be any desired layer. In some embodiments, the substrate 140 may have more than one layer 145. The substrate 140 also has a photoresist layer 150 disposed over the layer 145. The substrate 140 has been previously exposed to electromagnetic radiation in an exposure stage of a photolithography process. The photoresist layer 150 has latent image lines 155 formed therein from the exposure stage. The latent image lines 155 may be substantially parallel. In some embodiments, the latent image lines 155 may predominant be substantially aligned in the same direction. In other embodiments, the latent image lines 155 may have other orientations.

In some embodiments, the substrate support assembly 138 may be an electrostatic chuck. In some embodiments, the body 124 of the substrate support assembly 138 may encapsulate an embedded heater 132. The embedded heater 132, such as a resistive element, is disposed in the substrate support assembly 138. The embedded heater 132 controllably heats the substrate support assembly 138 and the substrate 140 positioned thereon to a predetermined temperature. The embedded heater 132 is configured to quickly ramp the temperature of the substrate 140 and to accurately control the temperature of the substrate 140. In some embodiments, the embedded heater 132 is connected to and controlled by the power supply 174. The power supply 174 may be configured similarly to a power supply 170, discussed below.

In some embodiments the processing chamber 100 may include other heating sources. For example, heat lamps may be positioned within or outside the processing chamber 100. In some embodiments, one or more lasers may be used to heat the photoresist layer 150 (or other layer) positioned on the substrate 140. In some embodiments, the substrate support assembly 138 may be configured to circulate a high efficiency heat transfer fluid in order to more quickly increase the temperature of a substrate 140 positioned on the substrate support assembly 138.

In some embodiments, the substrate support assembly 138 may be configured to provide relative motion between the first surface 134 (and the substrate 140 positioned thereon) and the electrode assembly 116. For example, the substrate support assembly 138 may be configured to rotate about the z-axis. The substrate support assembly 138 may be configured to continuously or constantly rotate, or the substrate support assembly 138 may be configured to rotate in a step manner. For example, the substrate support assembly 138 may rotate a predetermine amount such as 90°, 180°, or 270° and then rotation may stop for a predetermined amount of time. After the predetermined amount of time, the rotation may continue in a step manner or in a continuous manner.

The substrate support assembly 138 may be configured to move vertically, i.e., in the z-direction. The stem 142 is coupled to a lift system (not shown) for moving the substrate support assembly 138 between an elevated processing position and a lowered substrate transfer position (as shown). The lift system may accurately and precisely control the position of the substrate 140 in the z-direction. In some embodiments, the lift system may also be configured to move the substrate 140 in the x-direction, the y-direction, or both the x-direction and the y-direction. The stem 142 additionally provides a conduit for electrical and thermocouple leads between the substrate support assembly 138 and other components of the processing chamber 100. A bellows 146 is coupled to the substrate support assembly 138 to provide a vacuum seal between the processing volume 112 and the atmosphere outside the processing chamber 100 and facilitate movement of the substrate support assembly 138 in the z-direction.

For example, the substrate support assembly 138 may move into a first position that places the first surface 134 inside of the electrode assembly 116 and a second position that spaces the first surface 134 below the electrode assembly 116. For example, the substrate support assembly 138 and the electrode assembly 116 may initially be separated by a distance of at least about 0.1 mm. A distance d defines the distance in the z-direction between the first surface 134 and the lower end of the electrode assembly 116.

The lid 110 may optionally include an inlet 180 through which gases provided by the supply sources 104 may enter the processing chamber 100. The supply sources 104 may optionally controllably pressurize the processing volume 112 with a gas, such as nitrogen, argon, helium, hydrogen, neon, chlorine, other gases, or combinations thereof. The gases from the supply sources 104 may create a controlled environment within the processing chamber 100. In other embodiments, the gases from supply sources 104 may be used to generate a plasma. For example, the plasma may be generated in a remote plasma source 160. The supply sources 104 may couple directly to the processing volume 112 through a supply conduit 105. In some embodiments, such as that of FIG. 1, the one or more source compounds may indirectly flow into the processing volume 112. As shown, the one or more source compounds first flow through the remote plasma source 160 before flowing into the processing volume 112.

The remote plasma source 160 may be configured to provide charged species, such as electrons, into the processing volume 112. The remote plasma source may be, for example, a capacitively coupled plasma source or an inductively coupled source. The remote plasma source 160 is coupled to a power supply 176. The power supply 176 may be, for example, an RF power supply. The power supply 176 may be configured to deliver power at a frequency of 10 Hz and about 1 MHz, such as about 5 kHz. In other embodiments, the power supply 176 may be configured to deliver power at 13.56 MHz. The power supply 176 and the remote plasma source 160 may be configured to generate a "soft" plasma. For example, the generated plasma may contain charged species having an ion energy of between about 1 eV and about 1000 eV, such as between about 5 eV and about 50 eV. In some embodiments, the ion energy may be between about 1 eV and about 5 eV. Electrons in the soft plasma may be used to drive the charged species generated from the photoacid generator in the direction perpendicular to the plane of the first surface 134. Driving the charged species in the z-direction may increase resist sensitivity.

In a representative example using a 300 mm substrate, the soft plasma may be generated as follows. It is contemplated that the gas flows may be scaled proportionately to the substrate diameter. Hydrogen gas may be provided into the remote plasma source 160 at a flow rate of between about 10 sccm and about 1000 sccm. Argon may optionally be flowed into the remote plasma source 160 at a flow rate of up to about 1000 sccm. A plasma may be generated in an inductively coupled remote plasma source 160 from an RF power of between about 400 W and about 800 W. The pressure of the processing volume 112 may be reduced to at least $10^{-5}$ Torr. For example, the pressure may be reduced to between about $10^{-6}$ Torr and about $10^{-8}$ Torr. The temperature of the substrate support assembly 138 may be maintained at between about 70° C. and about 160° C., such as between about 90° C. and 140° C.

The electrode assembly 116 includes one or more electrodes 120. As shown, the electrode assembly 116 is coupled to the power supply 170. In one embodiment, each electrode of the electrode assembly 116 is coupled to the power supply 170 through a voltage control mechanism 191 to allow independent control of the voltage provided to each electrode 120. Although the power supply 170 is shown coupled to a single end of the electrodes 120, the second end of the electrodes 120 may be connected to the ground of the power supply 170 to complete a circuit. The electrodes 120 are arranged in an array around the substrate support assembly 138. In FIG. 1, the electrodes of the electrode assembly 116 are disposed within the chamber body 102 of the processing chamber 100. In another embodiment, the electrodes 120 of the electrode assembly 116 may be disposed outside the chamber body 102 of the processing chamber 100. The electrode assembly 116 may be operable, upon application of a voltage, to generate an electric field running directly above and parallel to the substrate support assembly 138, in both the axial and traverse directions. In another embodiment, the electrode assembly 116 is configured to generate an electric field running directly above and parallel to the substrate support assembly 138 in only the axial direction. In another embodiment, the electrode assembly 116 is configured to generate an electric field running directly above and parallel to the substrate support assembly 138 in only the traverse direction.

The power supply 170 and/or the power supply 174 may be configured to supply, for example, between about 50 kV and about 300 kV to each electrode of the electrode assembly 116 and/or the electrode assembly 118. The voltage applied in the vertical and horizontal directions is applied a rate of 1 MV/m. One of the electrodes in the electrode assembly 116 is designated as the base electrode. The base electrode is provided with a voltage $V_{base}$. Each subsequent electrode (i.e., non-base electrode) in the electrode assembly 116 is provided with a fraction of the voltage $V_{base}$. For example, each subsequent electrode in the electrode assembly 116 is provided a voltage $V_i$, where $V_i = V_{base} \cos(a_j - a_i)$. The voltage control mechanism 191 is coupled with the power supply 170 to deliver a specific $V_j$ to each electrode. This expression is discussed with more detail in the discussion of FIG. 2A.

In some embodiments, one or more magnets 196 may be positioned in the processing chamber 100. In the embodiment shown in FIG. 1, the magnets 196 are coupled to the inside surface of the sidewalls 106. In other embodiments, the magnets 196 may be positioned in other locations within the processing chamber 100 or outside the processing chamber 100. For example, the magnets 196 may be positioned within the processing chamber 100 and adjacent to the bottom 108 and/or the lid 110. The magnets 196 may be, for example, permanent magnets or electromagnets. Representative permanent magnets include ceramic magnets and rare earth magnets. In embodiments where the magnets 196 include electromagnets, the magnets 196 may be coupled to a power supply (not shown). The magnets 196 are configured to generate a magnetic field in a parallel direction, a perpendicular direction, or other direction relative to the electric field generated by electrode assembly 116 and/or the electrode assembly 118. The magnets 196 may be configured to generate a field strength across the first surface 134 of between about 0.1 Tesla (T) and about 10 T, such as between about 1 T and about 5 T. In embodiments including a magnetic field, the magnets 196 may remain stationary or move relative to the first surface 134.

The above described processing chamber 100 can be controlled by a processor based controller, such as controller 198. For example, the controller 198 may be configured to control flow of various precursor and process gases and purge gases from gas sources, during different operations of a substrate process sequence. The controller 198 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing chamber 100 to facilitate control of the substrate processing. The controller 198 also includes hardware for monitoring substrate processing through sensors in the processing chamber 100, including sensors monitoring the precursor, process gas and purge gas flow. Other sensors that measure system parameters such as substrate temperature, chamber atmosphere pressure and the like, may also provide information to the controller 198.

To facilitate control of the processing chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 199 are coupled to the CPU 192 for supporting the processor in a conventional manner. Charged species generation, heating, and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2A:
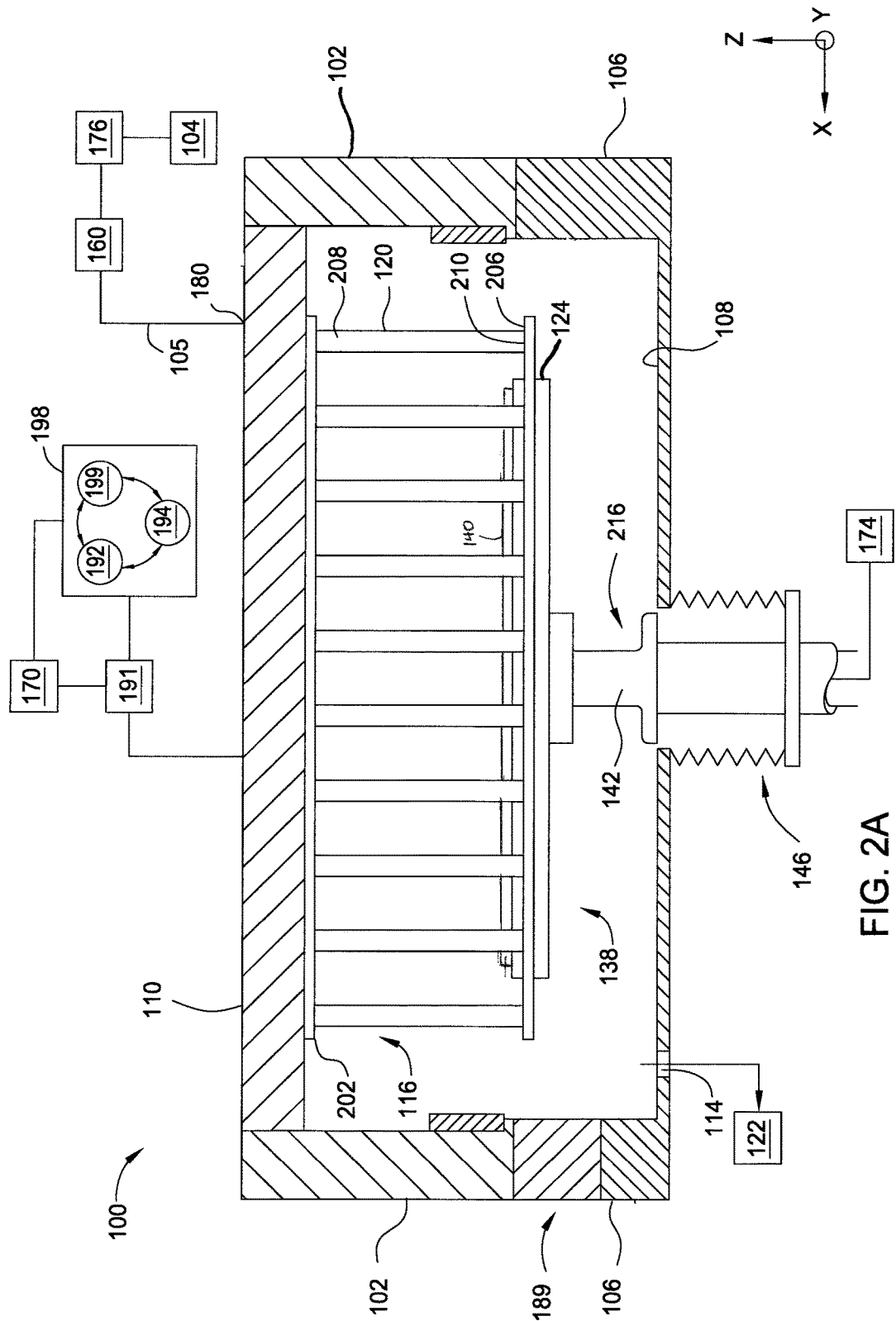
FIG. 2A is a schematic cross-sectional view the apparatus of FIG. 1 with the substrate support assembly in a raised position such that an electrode assembly circumscribes the substrate supported on the substrate support assembly.

FIG. 2A illustrates the substrate support assembly 138 in a raised position such that the electrode assembly 116 circumscribes the substrate 140 supported on the substrate support assembly 138. Although the processing chamber 100 and the substrate support assembly 138 are illustrated in cross-section in FIG. 2A, the electrode assembly 116 is not shown in cross-section to better illustrate the interplay between the substrate support assembly 138 and electrode assembly 116 as further described below. The electrode assembly 116 includes a plurality of electrodes 120, and optionally one or both of a top plate 202 and a bottom plate 206. The electrodes 120 may be fabricated from an electrically conductive material, such as a metal or metal allow, for example, aluminum. Each electrode 120 has a first end 208 and a second end 210. The first end 208 of each electrode 120 is coupled with the top plate 202. The top plate 202 may be coupled to the lid 110 of the processing chamber 100. In one example, the electrodes 120 are arranged in a polar array, for example with each electrode 120 equally spaced around a centerline of the substrate support assembly 138, such that the electrode assembly 116 formed a cylindrical cage. The electrodes 120 extend down from the top plate 202 and are of sufficient length to circumscribe and enclose the substrate 140 disposed on the substrate support assembly 138 when the substrate support assembly 138 is in a raised position for processing.

The substrate support assembly 138 may be moved to the lowered position as shown in FIG. 1. In the lowered position, the second end 210 of each electrode 120 of the electrode assembly 116 is spaced in the z-direction from the substrate support assembly 138 by a distance d. The distance d is sufficient to allow a robot (not shown), entering the processing may enter a slit valve 189 formed in a sidewall 106 of the processing chamber 100 and deliver a substrate (not shown) to the substrate support assembly 138 for processing. Once the substrate is positioned on the substrate support assembly 138, an actuator (not shown) may raise the substrate support assembly 138 to an extended position 216 for processing the substrate 140. A bellows 146 is coupled to the substrate support assembly 138 to provide a vacuum seal between the processing volume 112 and the atmosphere outside the processing chamber 100 and facilitate movement of the substrate support assembly 138 in the z-direction. In the extended position 216, the second end 210 of each electrode 120 overlaps the substrate support assembly 138 such that the electrode assembly 116 circumscribes the substrate 140 supported on the substrate support assembly 138. The bottom plate 206 of the electrode assembly 116 may have a ring-shape to allow the substrate support assembly 138 to pass between the electrodes 120. The cage-like structure of the electrode assembly 116 allows for a more uniform electric field directly above the substrate 140.

Each electrode 120 in the electrode assembly 116 is coupled to a power supply 170. The voltage applied by the power supply 170 to each electrode 120 may be selected in response to which electrode 120 is designated as the base electrode. The base electrode is provided with a voltage such that $V_{base}=V_0$. Each of the remaining electrodes 120 (i.e., the electrodes 120 which is not the base electrode) is provided with a voltage $V_i$, where $V_i=V_0 \cos(a_f-a_i)$, wherein $a_f$ is the angle with respect to the x-axis in which the transverse field is uniform; $a_i$ is the angle with respect to the x-axis of the electrode 120. By designating a base electrode, the user can control the direction of the electric field across the electrode assembly 116. The direction of the electric field is dictated by whatever electrode 120 is designated as the base electrode. Thus, the direction of the electric field may be selected for an individual substrate without having to change the hardware of the processing chamber 100, which is useful when sequentially processing multiple substrates. For example, the predominant direction of photo acid lines on a given substrate may differ from other substrates being processed in the processing chamber 100. Thus, by selecting which electrode 120 is the base electrode, and re-distributing voltages $V_i$ to the remaining electrodes 120, the electric field direction may be set parallel to the predominant direction of photo acid lines for a particular substrate.

The controller 198 may be used to designate which electrode 120 is the base electrode and communicate with a voltage control mechanism 191 to distribute the voltages to each respective electrode 120 in accordance with $V_i=V_0 \cos(a_f-a_i)$. Information as to the predominant direction of photo acid lines on a particular substrate may be provided to the controller 198 from other processors, or the direction may be determined using sensors.

Alternatively, the base electrode may remain constant, and the substrate support assembly 138 may be configured to rotate about the z-axis to align the predominant photo acid line direction with the direction of the electric field. The substrate support assembly 138 optionally may be configured to continuously rotate, or the substrate support assembly 138 may be configured to rotate in a step-wise manner to change the alignment of the electric field during processing. For example, the substrate support assembly 138 may rotate a predetermined amount, such as 90°, 180°, or 270°, and then stop rotation for a predetermined amount of time to allow processing to occur while the substrate is in that orientation. After the predetermined amount of time, the rotation may continue in a step or continuous manner for additional processing.

Figure 2B:
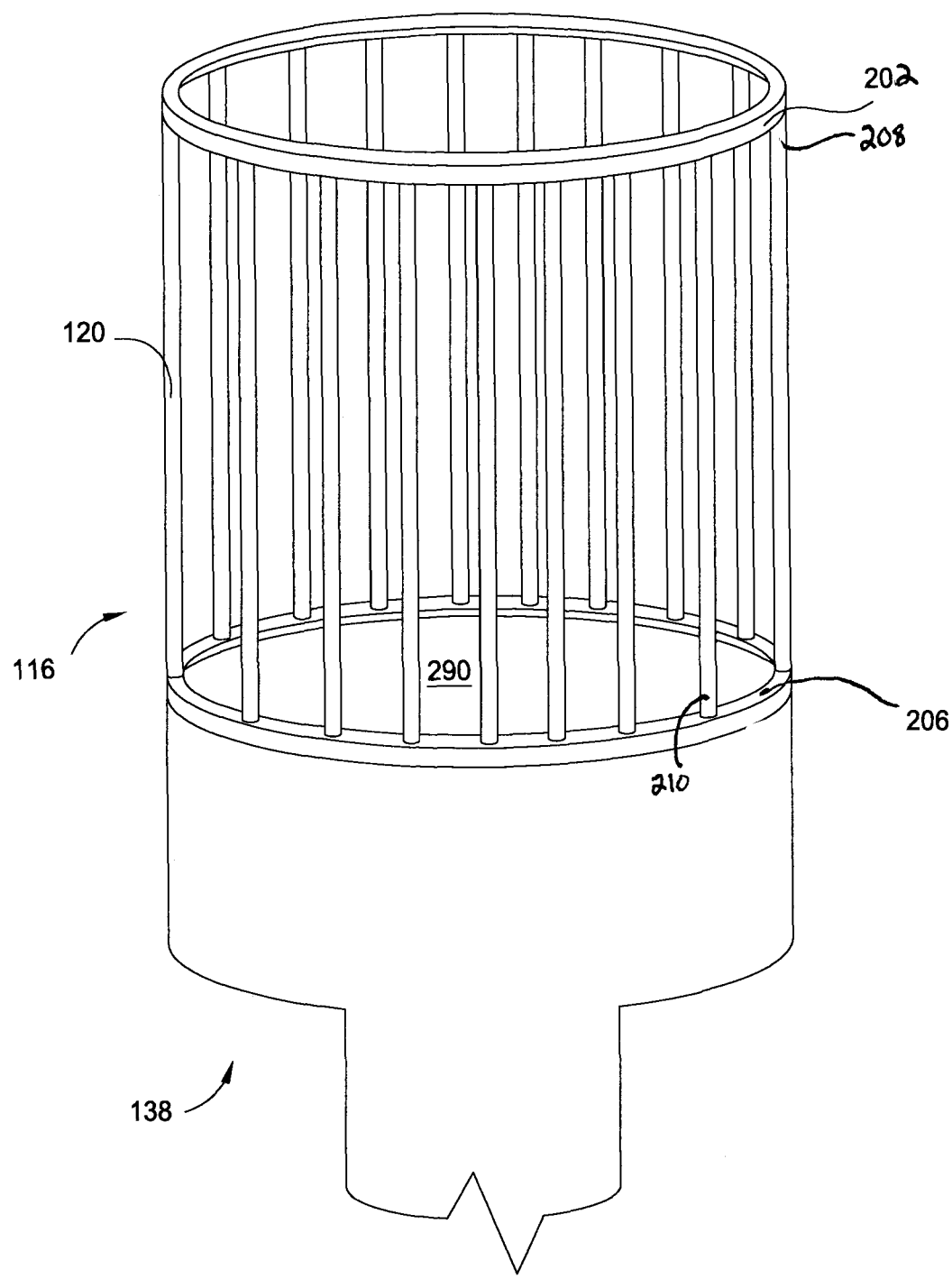
FIG. 2B is an enlarged view of an alternative embodiment of the electrode assembly.

FIG. 2B is an enlarged view of an alternative embodiment of the electrode assembly 116. The electrodes 120 of electrode assembly 116 are arranged to contact the substrate support assembly 138 when the substrate support assembly 138 is in the extended position 216. A bottom plate 206 is disposed on the substrate support assembly 138. The bottom plate 206 is ring-shaped to circumscribe a substrate 290 disposed on the substrate support assembly 138, and as such, the plurality of electrodes 120 of the electrode assembly 116 also circumscribe the substrate 290. The electrode assembly 116 is coupled to the voltage control mechanism 191 and the power supply 170 to deliver a specific voltage to each electrode 120 as discussed above.

Figure 3:
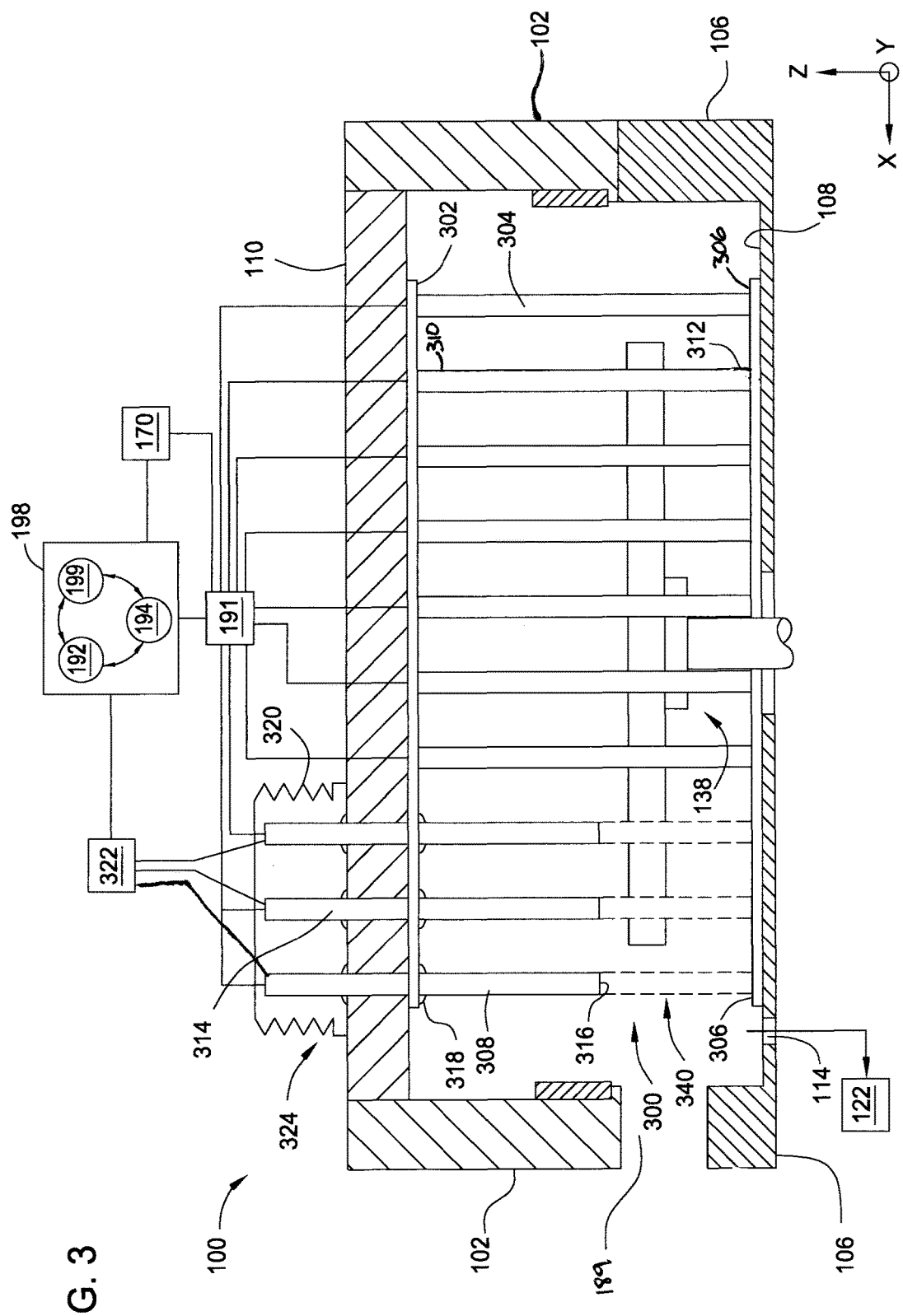
FIG. 3 is a schematic cross-sectional view of an apparatus for processing a substrate showing another example of an electrode assembly.

FIG. 3 illustrates another embodiment of an electrode assembly 300 disposed in a processing chamber 100. Similar to the electrode assembly 116 illustrated in FIG. 2A, the electrode assembly 300 is not shown in cross-section in FIG. 3. Additionally, section line through the processing chamber 100 is not linear to allow the portions of the electrode assembly 300 extending through the chamber body 102 of the processing chamber 100 to be illustrated.

The electrode assembly 300 includes a plurality of stationary electrodes 304 and a plurality of opening electrodes 308, and optionally one or both of a top plate 302 and a bottom plate 306. An actuator 322 is coupled to the opening electrodes 308 and is operable to move the opening electrodes 308 in a vertical (z) direction. Each stationary electrode 304 has a first end 310 and a second end 312. The first end 310 of each stationary electrode 304 is coupled to the top plate 302. The second end 312 of each stationary electrode 304 is coupled to the bottom plate 306. The bottom plate 306 may, for example, be disposed on the substrate support assembly 138 or on the bottom 108 of the processing chamber 100, as shown in FIG. 3. The electrodes 304, 308 are arranged in a polar array, for example, with each electrode 304, 308 being equally spaced around the substrate support assembly 138. The electrode assembly 300 is coupled to a power supply 170 and a voltage control mechanism 191 that are configured to operate the electrode assembly 300 as described above.

Each opening electrode 308 has a first end 314 and a second end 316. At least a portion of the first end 314 of the opening electrode 308 may sealably extend out of the processing chamber 100 through a port 318 in the lid 110. A bellows 320 is coupled to an exterior 322 of the lid 110, around the port 318, to provide a vacuum seal between the processing volume 112 and the atmosphere outside the processing chamber 100 and to facilitate movement of the opening electrode 308 in the z-direction. The opening electrodes 308 are coupled to an actuator 322 through the port 318. The actuator 322 may raise or lower the opening electrodes 308. In a retracted position 324, the first end 314 of the opening electrode 308 is extended at least partially outside the processing chamber 100 to allow access to an interior 326 of the electrode assembly 300 bounded by the electrodes 304, 308. A robot (not shown) may extend into the interior 326 of the electrode assembly 300 through a slit valve 189 formed in a sidewall 106 of the processing chamber 100 and place a substrate (not shown) on the substrate support assembly 138.

Once the robot is retracted from the processing chamber 100 after transferring the substrate on the electrode assembly 300, a controller 198 may communicate with the actuator 322 to lower the opening electrodes 308 to a lowered position 340 (shown in phantom). In the lowered position 340, the second ends 316 of the opening electrodes 308 contact the bottom plate 306 to provide an electrical return path to back to the ground of the power supply 170. The controller 198 may select one of the electrodes 304, 308 as the base electrode as described above. The controller 198 communicates with the voltage control mechanism 191 to distribute the proper voltages to each electrode 304, 308.

Optionally, the base electrode may remain constant (i.e., not selected by the controller 198), and the substrate support assembly 138 may be configured to rotate about the z-axis to align the predominant photo acid line direction with the direction of the electric field. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. After the predetermined amount of time, the rotation may continue in a step manner or in a continuous manner.

Figure 4:
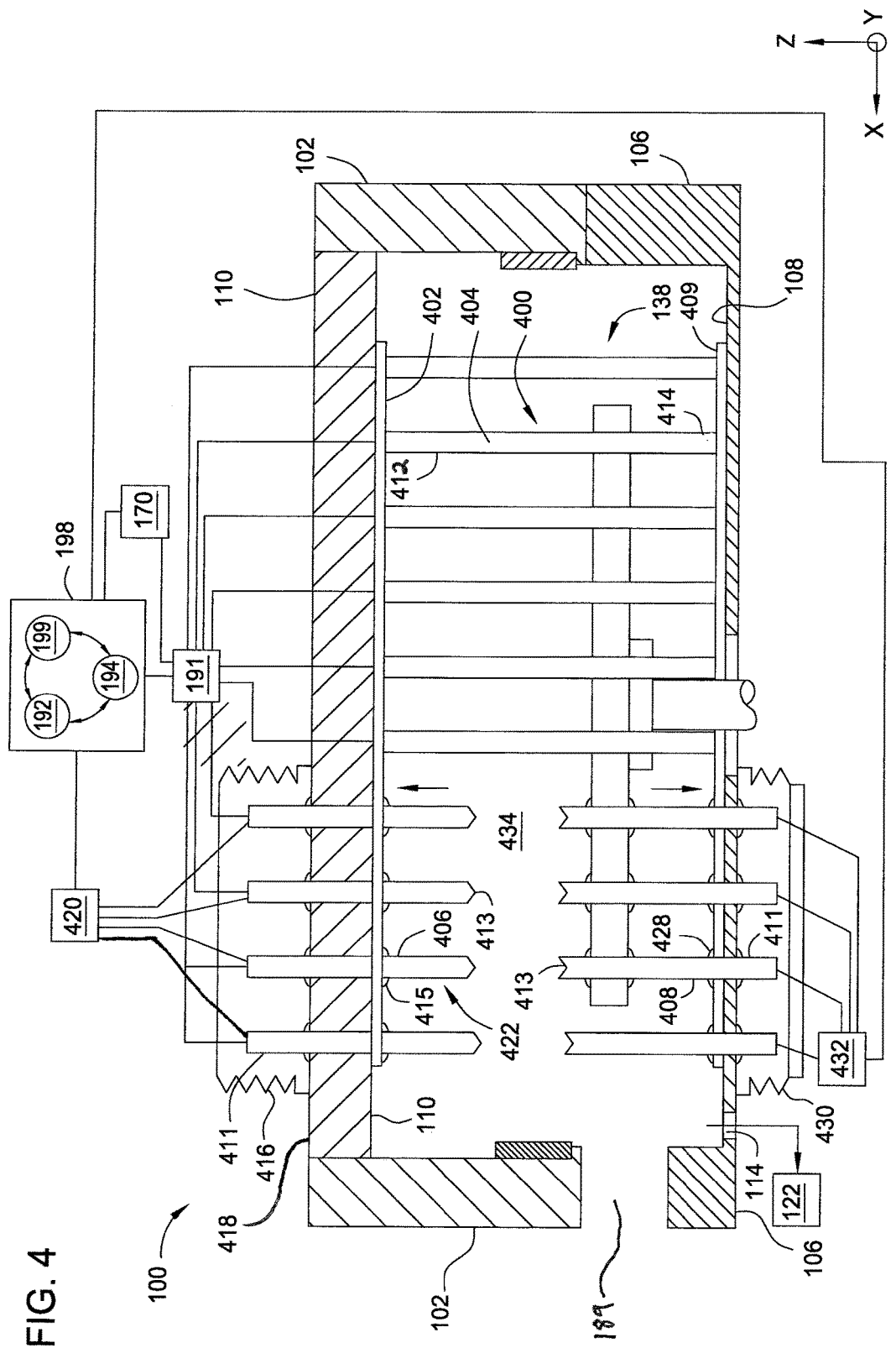
FIG. 4 is a schematic cross-sectional view of an apparatus for processing a substrate showing one example of an electrode assembly.

FIG. 4 illustrates another embodiment of an electrode assembly 400 disposed in a processing chamber 100. Similar to the electrode assembly 116 illustrated in FIG. 2A, the electrode assembly 400 is not shown in cross-section in FIG. 4. Additionally, section line through the processing chamber 100 is not linear to allow the portions of the electrode assembly 400 extending through the chamber body 102 of the processing chamber 100 to be illustrated.

The electrode assembly 400 includes a plurality of stationary electrodes 404, a plurality of top opening electrodes 406, and a plurality of bottom opening electrodes 408. The electrode assembly 400 may optionally include one or both of a top plate 402 and a bottom plate 409. The electrodes 404, 406, 408 of the electrode assembly 400 are arranged in a polar array, such that the electrodes 404, 406, 408 circumscribe the substrate support assembly 138.

Each stationary electrode 404 has a first end 412 and a second end 414. The first end 412 of each stationary electrode 404 is coupled to the top plate 402. The top plate 402 is coupled to the lid 110 of the processing chamber 100. The second end 414 of each stationary electrode 404 is coupled to the bottom plate 409. The bottom plate 409 may be coupled to the bottom 108 of the processing chamber 100.

The electrode assembly 400 further includes at least one top opening electrode 406 and at least one bottom opening electrode 408. Each opening electrode 406, 408 has a first end 411 and a second end 413. The first end 411 of the top opening electrode 406 may extend at least partially outside the processing chamber 100 through a port 415 formed in the lid 110. A bellows 416 is coupled to an exterior 418 of the lid 110, around the port 415, to provide a vacuum seal between the processing volume 112 and the atmosphere outside the processing chamber 100 and to facilitate movement of the top opening electrode 406 in the z-direction. The top opening electrodes 406 are coupled to an actuator 420 through the port 415. The actuator 420 may raise or lower the top opening electrodes 406. In a retracted position 422, the first end 411 of the top electrode 406 is extended at least partially outside the processing chamber 100 to allow access to the interior 434 of the electrode assembly 400 for substrate transfer with the substrate support assembly 138.

The first end 411 of the bottom opening electrode 408 extends below the substrate support assembly 138 and at least partially outside the bottom 108 of the processing chamber 100 through a second port 428. A bellows 430 is coupled to the bottom of the processing chamber 100, around the second port 428, to provide a vacuum seal between the processing volume 112 and the atmosphere outside the processing chamber 100 to facilitate movement of the bottom opening electrode 408 in the z-direction.

The bottom opening electrode 408 is coupled to a second actuator 432 through the ports 428. The second actuator 432 may raise or lower the bottom opening electrodes 408. In a retracted position 422, the first end 411 of the bottom opening electrode 408 is extended below the substrate support assembly 138 to allow access to the interior 434 of the electrode assembly 400. When both opening electrodes 406, 408 are in a retracted position 422, a robot (not shown) may extend into the interior 434 of the electrode assembly 400 through a slit valve 189 formed in a sidewall 106 of the processing chamber 100 and place a substrate (not shown) on the substrate support assembly 138. Once the robot is cleared of the electrode assembly 400, a controller 198 may communicate with the actuator 420 to place the opening electrodes 406, 408 to a closed position (not shown). In the closed position, the second end 413 of the top opening electrode 406 and the second end 413 of the bottom opening electrodes 408 connect with each other to form a continuous electrode such that the electrode assembly 400 completely circumscribes the substrate disposed on the substrate support assembly 138.

The controller 198 may select one of the electrodes 404, 406, 408 as the base electrode. The controller 198 communicates with a voltage control mechanism 191 and power supply 170 to distribute the proper voltages to each electrode 404, 406, 408 as described above. By designating a base electrode, the user can control the direction of the electric field across the electrode assembly 400.

Alternatively, the base electrode may remain constant, and the substrate support assembly 138 may be configured to rotate about the z-axis to align the predominant photo acid line direction with the direction of the electric field. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. After the predetermined amount of time, the rotation may continue in a step manner or in a continuous manner.

What is claimed is:

1. A processing chamber comprising:
a chamber body;
a substrate support disposed in the chamber body; and
an electrode assembly configured to couple to a power source, the electrode assembly comprising:
a top plate disposed above the substrate support;
a bottom plate having an opening therethough, wherein a portion of the substrate support is disposed through the opening; and
a plurality of electrodes in a cylindrical arrangement connecting the top plate to the bottom plate, wherein at least one electrode of the plurality of electrodes is operable to disengage from the bottom plate.

2. The processing chamber of claim 1, wherein the plurality of electrodes are disposed inside the chamber body.

3. The processing chamber of claim 1 further comprising:
a voltage control mechanism configured to independently control voltage provided to each of the electrodes.

4. The processing chamber of claim 3, wherein the voltage control mechanism is configured to independently control voltage provided to a first electrode of the plurality of electrodes based on an angular orientation of the first electrode.

5. The processing chamber of claim 1, wherein the substrate support assembly is rotatable.

6. A processing chamber comprising:
a chamber body;
a substrate support disposed in the chamber body; and
an electrode assembly disposed in a processing volume defined by the chamber body and configured to couple to a power source, the electrode assembly comprising:
a top plate disposed above the substrate support;
a bottom plate disposed below the substrate support; and
a plurality of electrodes in a cylindrical arrangement connecting the top plate to the bottom plate, each electrode in the plurality of electrodes having a first end and a second end, the first end contacting the top plate and the second end contacting the bottom plate, wherein a portion of the plurality of electrodes is operable between a position where the second end of the electrode contacts the bottom plate and a position where the second end of the electrode is spaced from the bottom plate.

7. The processing chamber of claim 6, wherein the portion of the plurality of electrodes is displaced vertically to electrically connect and disconnect the top plate to the bottom plate.

8. The processing chamber of claim 6 further comprising:
a voltage control mechanism configured to independently control voltage provided to each of the electrodes.

9. The processing chamber of claim 8, wherein the voltage control mechanism is configured to independently control voltage provided to a first electrode of the plurality of electrodes based on an angular orientation of the first electrode.

10. The processing chamber of claim 6, wherein the substrate support assembly is rotatable.

11. A processing chamber comprising:
a chamber body;
a substrate support disposed in the chamber body coupled to a shaft; and
an electrode assembly configured to couple to a power source, the electrode assembly comprising:
a top plate disposed above the substrate support;
a bottom plate disposed below the substrate support surrounding the shaft; and
a plurality of electrodes in a cylindrical arrangement within the chamber body connecting the top plate to the bottom plate, wherein a portion of the plurality of electrodes is displaced vertically to electrically connect and disconnect the top plate to the bottom plate.

12. The processing chamber of claim 11 further comprising:
a voltage control mechanism configured to independently control voltage provided to each of the electrodes.

13. The processing chamber of claim 12, wherein the voltage control mechanism is configured to independently control voltage provided to a first electrode of the plurality of electrodes based on an angular orientation of the first electrode.

14. The processing chamber of claim 11, wherein the substrate support assembly is rotatable.

* * * * *